United States Patent
Kim

(10) Patent No.: US 7,984,249 B2
(45) Date of Patent: Jul. 19, 2011

(54) METHOD FOR WRITING A FILE BY DIFFERENT WRITING SCHEMES ACCORDING TO FILE CHARACTERISTICS AND ELECTRONIC DEVICE USING THE METHOD

(75) Inventor: Kyung-sik Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 529 days.

(21) Appl. No.: 11/751,069

(22) Filed: May 21, 2007

(65) Prior Publication Data

US 2008/0082723 A1    Apr. 3, 2008

(30) Foreign Application Priority Data

Oct. 2, 2006    (KR) .................. 10-2006-0097155

(51) Int. Cl.
*G06F 12/00*    (2006.01)

(52) U.S. Cl. ................ 711/154; 711/100; 711/E12.001; 725/115

(58) Field of Classification Search .................... 711/101
See application file for complete search history.

(56) References Cited

U.S. PATENT DOCUMENTS

| | | | |
|---|---|---|---|
| 6,418,506 B1* | 7/2002 | Pashley et al. | 711/103 |
| 2002/0124099 A1* | 9/2002 | Srinivasan et al. | 709/231 |
| 2004/0103238 A1* | 5/2004 | Avraham et al. | 711/102 |
| 2004/0234236 A1 | 11/2004 | Torobu | |
| 2005/0117892 A1 | 6/2005 | Nishida | |
| 2007/0061511 A1* | 3/2007 | Faber | 711/113 |
| 2007/0168698 A1* | 7/2007 | Coulson et al. | 714/5 |
| 2007/0220227 A1* | 9/2007 | Long | 711/165 |

FOREIGN PATENT DOCUMENTS

| | | |
|---|---|---|
| CN | 1405683 A | 3/2003 |
| EP | 1 239 673 A | 9/2002 |

OTHER PUBLICATIONS

Communication dated Jul. 13, 2010 from corresponding Chinese Patent Application No. 200710137381.8.

* cited by examiner

*Primary Examiner* — Reginald G Bragdon
*Assistant Examiner* — Arvind Talukdar
(74) *Attorney, Agent, or Firm* — Sughrue Mion, PLLC

(57) ABSTRACT

A method for writing a file by different writing schemes according to file characteristic and electronic device using the method are provided. A method for writing a file is provided, including writing a first file to a memory according to a first writing scheme if the file to be written to the memory is the first file, and writing a second file to the memory according to a second writing scheme which is different from the first writing scheme if the file to be written to the memory is the second file different from the first file.

22 Claims, 4 Drawing Sheets

METHOD FOR WRITING A FILE BY DIFFERENT WRITING SCHEMES ACCORDING TO FILE CHARACTERISTICS AND ELECTRONIC DEVICE USING THE METHOD

CROSS-REFERENCE TO RELATED APPLICATIONS

This application claims priority from Korean Patent Application No. 10-2006-0097155, filed Oct. 2, 2006, in the Korean Intellectual Property Office, the entire contents of which are incorporated herein by reference.

BACKGROUND OF THE INVENTION

1. Field of the Invention

Methods and apparatuses consistent with the present invention relate to writing a file, and more particularly, to a method for writing a file by different writing schemes according to file characteristics, and an electronic device using the method.

2. Description of the Related Art

A NAND flash memory is a type of related art semiconductor memory element for writing files. The NAND flash memory consumes less power and is more compact than a hard disk drive (HDD), and has thus become widely used.

Unlike an HDD, the NAND flash memory cannot be overwritten. Accordingly, two steps of erasing and writing must be performed. Further, reading and writing is performed by the page, whereas deleting is performed by the block, i.e., a write area consisting of a plurality of pages.

Furthermore, the related art NAND flash memory, unlike an HDD, has no separate write area for metadata for a file.

As a result of such differences, the related art method for writing a file to a NAND flash memory is also different from that of writing a file to an HDD. The method for writing a file to a NAND flash memory is described in detail below with reference to FIG. 1.

FIG. 1 illustrates a write area on a related art NAND flash memory comprising a plurality of blocks B1, B2, B3, B4 .... In FIG. 1, a single block comprises four pages P1, P2, P3 and P4.

When writing a file to a related art NAND flash memory, metadata for the file is first written to the NAND flash memory, followed by the data constituting the file. While writing the data, the metadata is updated periodically (for example, every five minutes). Updating the metadata involves writing new metadata reflecting the data recording conditions up to the point when the metadata is updated.

In FIG. 1, metadata M1 is initially written on page P1 of block B1; data D1, D2 and D3 are written on pages P2, P3 and P4 of block B1, respectively; metadata M2 is updated on page P1 of block B2; and data D4, D5 and D6 are written on pages P2, P3 and P4 of block B2.

This related art process has at least the following problems:

Firstly, increased usage of the write area of a NAND flash memory occurs due to frequent updating of metadata, so the life span of the related art NAND flash memory can be reduced.

Secondly, if metadata are updated, the previous metadata is useless, resulting in a fragmented block which has a page of the useless metadata. In FIG. 1, the fragmented block is block B1 having page 1 where the useless metadata are written. The fragmented block can obstruct efficient usage of a related art NAND flash memory.

To use the page of the fragmented block where the useless metadata are written, necessary data is moved to another write area, and then all fragmented block is deleted.

In FIG. 1, in order to use page P1 of block B1 where the useless metadata M1 is written, data D1, D2 and D3 written on pages P2, P3 and P4 of block B1 is moved to another block (for example, block B3), and then block B1 is deleted.

Because deletion in a NAND flash memory is performed by the block as described above, frequent data deletion and movement can reduce the life span of a NAND flash memory.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a method for writing a file by different writing schemes according to the file characteristics, and an electronic device using the method.

According to an aspect of the present invention, there is provided a method for writing a file, comprising writing a first file to a memory according to a first writing scheme if the file to be written to the memory is the first file, and writing a second file to the memory according to a second writing scheme which is different from the first writing scheme if the file to be written to the memory is the second file different from the first file.

The first file may not be deleted from the memory if power to the memory is turned off, and the second file may be deleted from the memory if power to the memory is turned off.

The first file may comprise an image requested to be recorded, and the second file may comprise an image necessary for providing a time shift function.

The first writing scheme may periodically update file information, which has been already written, regarding the first file, and the second writing scheme may not update file information, which has been already written, regarding the second file. The file information may be metadata.

The first writing scheme may write the file information regarding the first file, if the first file is completely written, and the second writing scheme may not write the file information regarding the second file, if the second file is completely written.

The memory may be one of a flash memory and a NAND flash memory.

According to another aspect of the present invention, there is provided an electronic device comprising a memory to which a file is written, and a controller which writes a first file to the memory according to a first writing scheme if the file to be written to the memory is the first file, and writes a second file to the memory according to a second writing scheme which is different from the first writing scheme if the file to be written to the memory is the second file which is different from the first file.

The first file may not be deleted from the memory if power to the memory is turned off, and the second file may be deleted from the memory if power to the memory is turned off.

The first file may comprise an image requested to be recorded, and the second file may comprise an image necessary for providing a time shift function.

The first writing scheme may periodically update file information, which has been already written, regarding the first file, and the second writing scheme may not update file information, which has been already written, regarding the second file. The file information may be metadata.

The first writing scheme may write file information regarding the first file, if the first file is completely written, and the second writing scheme may not write file information regarding the second file, if the second file is completely written.

The memory may be one of a flash memory and a NAND flash memory.

According to another aspect of the present invention, there is provided a method for writing a file, comprising writing file information regarding the file to be written to a memory, and writing the file without updating the file information. The file may be deleted from the memory if the power to the memory is turned off.

According to another aspect of the present invention, there is provided an electronic device comprising a memory to which a file is written, and a controller which writes file information regarding the file to be written to the memory and then writes the file without updating the file information. The file may be deleted from the memory if the power to the memory is turned off.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS OF THE PRESENT INVENTION

Figure 1:
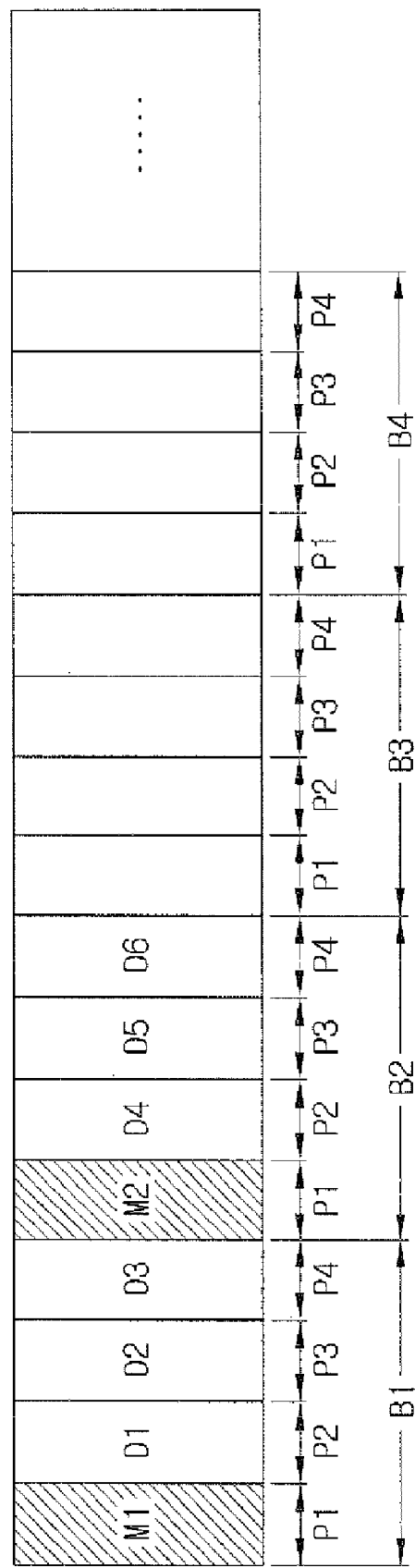
FIG. 1 is provided to show a related art method for writing a file to a NAND flash memory.

Reference will now be made in detail to the exemplary embodiments of the present invention, examples of which are illustrated in the accompanying drawings, wherein like reference numerals refer to like elements throughout. The exemplary embodiments are described below by referring to the figures.

Figure 2:
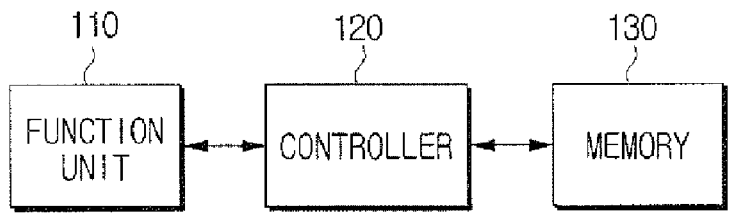
FIG. 2 is a block diagram showing an electronic device according to an exemplary embodiment of the present invention.

FIG. 2 is a block diagram showing an electronic device according to an exemplary embodiment of the present invention. The electronic device can write a file. When writing a file, the electronic device adopts different writing schemes according to the file characteristics, as is described in detail below.

As shown in FIG. 2, the electronic device according to an exemplary embodiment of the present invention comprises a function unit 110, a controller 120 and memory 130.

The function unit 110 performs an inherent function of the electronic device. For example but not by way of limitation, if the electronic device is a display device, the function unit 110 performs the function of displaying an image.

The memory 130 is a type of storage device in which a file is written. The memory 130 may be a semiconductor storage device implemented with a flash memory, such as a NAND flash memory, but not limited thereto.

The controller 120 operates the function unit 110, and writes a file to the memory 130. When writing the file, the electronic device adopts different writing schemes according to the file characteristics, as discussed in greater detail with reference to FIG. 3.

Figure 3:
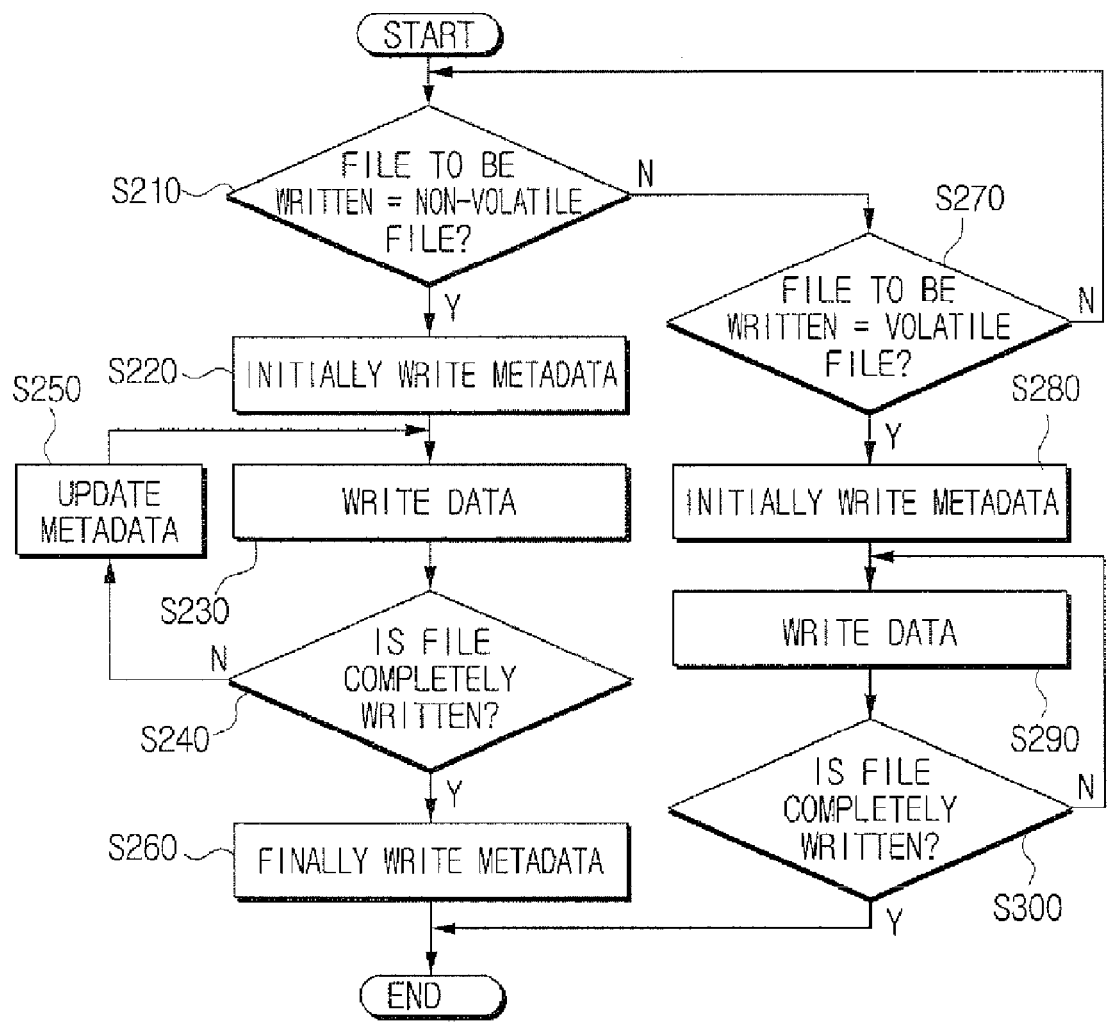
FIG. 3 is a flow diagram showing a method for writing a file using the electronic device of FIG. 2 according to an exemplary embodiment of the present invention.

FIG. 3 is a flow diagram showing a method for writing a file using the electronic device of FIG. 2 according to an exemplary embodiment.

The controller 120 determines the characteristic of the file to be written to the memory 130 in operations S210 and S270. More specifically, the controller 120 determines whether the file is a volatile file or a non-volatile file.

Volatile files are files which are deleted from the memory 130 when the power to the electronic device is transited to an off position, that is, when the power to the memory 130 is transited to an off position. Volatile files include files having an image necessary for providing a time shift function. Such a file is deleted from the memory 130 when the electronic device is transited to an off position. The 'time shift function' is a function for displaying broadcasts prior to the present broadcast (that is, previous broadcast) on screen.

Non-volatile files are files which are not deleted from the memory 130 even when the power to the electronic device is transited to an off position, that is, when the power to the memory 130 is transited to an off position. Non-volatile files include files having images to be saved. Such a file is not deleted from the memory 130 when the electronic device is transited to an off position.

The process of writing a non-volatile file to the memory 130 is described in greater detail below.

If a file to be written is determined to be a non-volatile file in operation S210-Y, the controller 120 initially writes metadata for the file to the memory 130 in operation S220. The metadata includes information regarding the file, comprising the title, generation time and modification time of the file. However, the exemplary embodiment is not limited to this information, and other information may be substituted therefore, as would be understood by those skilled in the art.

Subsequently, the controller 120 writes data including the file to the memory 130 in operation S230, and then determines whether the file has been substantially completely written in operation S240. More specifically, in operation S240, the controller 120 determines whether the data constituting the file is completely written to the memory 130 or there is data remaining to be written to the memory 130. Operation S240 may be performed intermittently (for example but not by way of limitation, every five minutes).

If the file is not completely written in operation S240-N, the controller 120 updates the metadata in operation S250 and keeps writing the data in operation S230.

Updating the metadata involves writing new metadata reflecting the data recording conditions up to the point where the metadata are updated, except for write areas where the initial metadata are written. As the metadata are updated based on the results of determination in operation S240, the metadata are updated in a determination cycle in operation S240.

Alternatively, if the file is completely written in operation S240-Y, the controller 120 finally writes the metadata and finishes writing the file in operation S260.

The final metadata regarding the completely written file is written to a write area which is not yet used in operations S220 and S250.

The process of writing a non-volatile file to the memory 130 has been described above. Herein below, the process of writing a volatile file to the memory 130 is described.

If a file to be written is determined to be a volatile file in operation S270-Y, the controller 120 initially writes metadata for the file to the memory 130 in operation S280. As discussed above, the metadata includes information regarding the file, comprising the title, generation time and modification time of the file, but is not limited thereto.

Subsequently, the controller 120 writes data constituting the file to the memory 130 in operation S290, and keeps writing the data to the memory 130 until the data are completely written, in operation S300.

Figure 4:
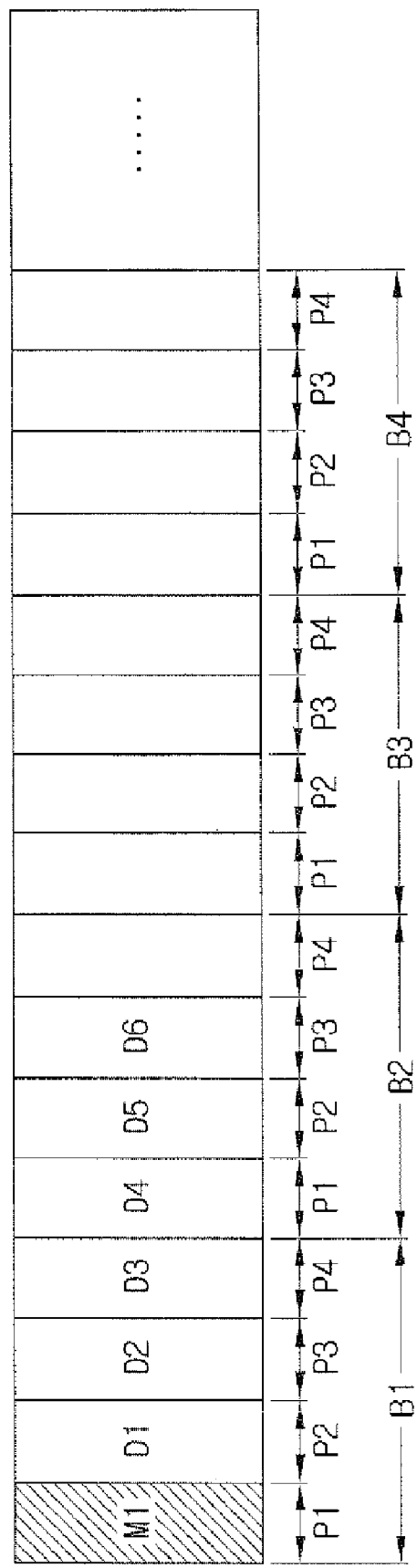
FIG. 4 is provided to show the process of writing a volatile file of FIG. 3 according to an exemplary embodiment of the present invention.

Accordingly, in the case of a volatile file, only the initial metadata is written, but the metadata is neither updated nor finally written. That is, metadata M1 for a volatile file is initially written to page P1 of block B1 in the memory 130, but not updated afterwards, as shown in FIG. 4. In FIG. 4, it is known that after metadata M1 is initially written, only data D1, D2, D3, D4, D5 and D6 constituting the file are written.

Figure 5:
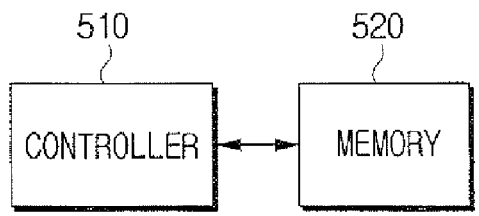
FIG. 5 is a block diagram showing an electronic device according to another exemplary embodiment of the present invention.

The process of writing a file by different writing schemes according to file characteristic (volatile/non-volatile) is described above using an exemplary embodiment. Herein below, another exemplary embodiment is described with reference to FIGS. 5 and 6. FIG. 5 is a block diagram showing an electronic device according to another exemplary embodiment, and FIG. 6 is a flow diagram showing a method for writing a file using the electronic device of FIG. 5.

As shown in FIG. 5, the electronic device according to another exemplary embodiment comprises a controller 510 and a memory 520. The memory 520 is a type of semiconductor storage device in which a file is written, and the controller 510 differently adopts different writing schemes according to the file characteristics.

Figure 6:
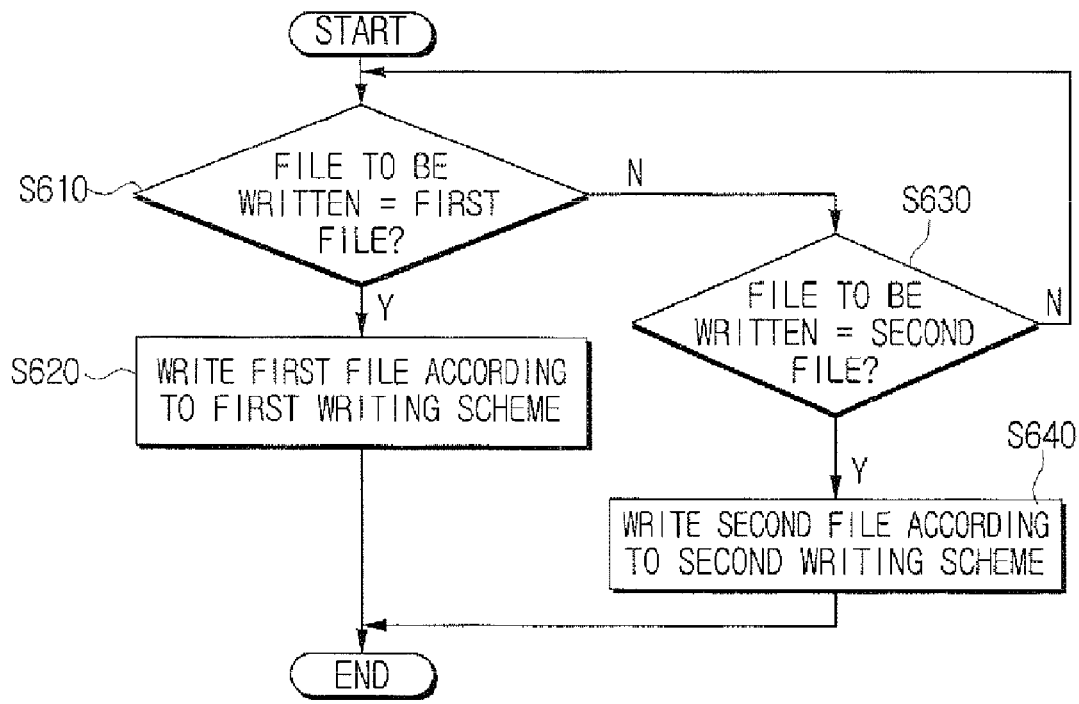
FIG. 6 is a flow diagram showing a method for writing a file using the electronic device of FIG. 5, according to an exemplary embodiment of the present invention.

More specifically, as shown in FIG. 6, if a file to be written in the memory 520 is a first file in operation S610-Y, the controller 510 writes the first file to the memory 520 according to the first writing scheme in operation S620. Alternatively, if a file to be written to the memory 520 is a second file, or any file other than the first file, in operation S630-Y, the controller 510 writes the second file to the memory 520 according to a second writing scheme, and not according to the first writing scheme, in operation S640.

The first file may be a non-volatile file, and the second file may be a volatile file. In this case, the first writing scheme updates file information regarding the first file, but the second writing scheme does not update file information regarding the second file.

According to yet another exemplary embodiment of the present invention, the controller 510 of the electronic device in FIG. 5 may be configured to record the file information regarding a file to be written to the memory 520 and then write the file to the memory 520 without updating the file information. The file to be written may be a volatile file.

As can be appreciated from the above description, different writing schemes can be applied according to the file characteristics. More specifically, if a file to be written is a volatile file, a writing scheme omitting metadata updates can be used. Accordingly, the frequency of updating the metadata is reduced in the case of volatile files, resulting in prolonging the life span of the memory and preventing overloading on electronic devices.

The foregoing exemplary embodiments are merely exemplary and are not to be construed as limiting the present invention. The present teaching can be readily applied to other types of apparatuses. Also, the description of the exemplary embodiments of the present invention is intended to be illustrative only, and not to limit the scope of the claims, as many alternatives, modifications, and variations will be apparent to those skilled in the art. Therefore, the scope of the present invention should be defined by the appended claims and their equivalents.

What is claimed is:

1. A method for writing a file, the method comprising:
    writing a first file that has been determined by a controller to be a non-volatile file, to a memory according to a first writing scheme if the file to be written to the memory is the first file; and
    writing a second file that has been determined by a controller to be a volatile file, to the memory according to a second writing scheme which is different from the first writing scheme if the file to be written to the memory is different from the first file,
    wherein the first writing scheme intermittently updates already-written file information regarding the first file, and
    the second writing scheme does not update already-written file information regarding the second file.

2. The method of claim 1, wherein the first file is not deleted from the memory if power to the memory is transited to an off position, and
    the second file is deleted from the memory if power to the memory is transited to the off position.

3. The method of claim 2, wherein the first file comprises an image requested to be recorded, and
    the second file comprises an image to provide a time shift function.

4. The method of claim 1, wherein the file information comprises metadata.

5. The method of claim 1, wherein the first writing scheme writes the file information regarding the first file if the first file has been written, and
    the second writing scheme does not write the file information regarding the second file, if the second file has been written.

6. The method of claim 1, wherein the memory comprises one of a flash memory and a NAND flash memory.

7. An electronic device comprising:
    a memory to which a file is written; and
    a controller which writes a first file, which has been determined by the controller to be a non-volatile file, to the memory according to a first writing scheme if the file to be written to the memory is the first file, and writes a second file, which has been determined by the controller to be a volatile file, to the memory according to a second writing scheme which is different from the first writing scheme if the file to be written to the memory is different from the first file,
    wherein the first writing scheme periodically updates file information, which has been already written, regarding the first file, and
    the second writing scheme does not update file information, which has been already written, regarding the second file.

8. The electronic device of claim 7, wherein the first file is not deleted from the memory if power to the memory is transited to an off position, and
the second file is deleted from the memory if power to the memory is transited to the off position.

9. The electronic device of claim 8, wherein the first file comprises an image requested to be recorded, and
the second file comprises an image to provide a time shift function.

10. The electronic device of claim 7, wherein the file information comprises metadata.

11. The electronic device of claim 7, wherein the first writing scheme writes file information regarding the first file, if the first file has been written, and
the second writing scheme does not write file information regarding the second file, if the second file has been written.

12. The electronic device of claim 7, wherein the memory comprises one of a flash memory and a NAND flash memory.

13. A method for writing a file, the method comprising:
determining, using a controller, whether a file to be written to a memory is a volatile or non-volatile file;
writing file information regarding the file to be written to the memory;
writing the entire file to the memory without updating the file information, if the file is determined to be a volatile file; and
writing the file to the memory while periodically updating the file information if the file is determined to be a non-volatile file.

14. The method of claim 13, wherein a volatile file is deleted from the memory if the power to the memory is transited to an off position.

15. The method of claim 13, wherein the file information comprises metadata.

16. The method of claim 13, further comprising:
determining that the file is a non-volatile file, if the first file comprises an image requested to be recorded; and
determining that the file is a volatile file, if the file comprises an image that may provide a time shift function.

17. The electronic device of claim 13, wherein only file data is written to memory file after file information is written, if the file is determined to be a volatile file.

18. An electronic device comprising:
a memory; and
a controller which determines whether a file to be written to the memory is a volatile or non-volatile file, writes file information regarding the file to be written to the memory, and then writes the entire file to the memory without updating the file information if the file is determined to be a volatile file, and writes the entire file to the memory while periodically updating the file information if the file is determined to be a non-volatile file.

19. The electronic device of claim 18, wherein the file is deleted from the memory if the power to the memory is transited to an off position.

20. The electronic device of claim 18, wherein the file information comprises metadata.

21. The electronic device of claim 18, wherein the controller determines a file to be a non-volatile file if the first file comprises an image requested to be recorded; and
wherein the controller determines the file to be a volatile file, if the file comprises an image that can provide a time shift function.

22. The electronic device of claim 18, wherein only file data is written to memory after file information is written, if the file is determined to be a volatile file.

* * * * *